United States Patent
Ho et al.

(10) Patent No.: US 9,437,433 B2
(45) Date of Patent: Sep. 6, 2016

(54) METHOD AND APPARATUS FOR COOLING WAFER IN ION IMPLANTATION PROCESS

(71) Applicant: Taiwan Semiconductor Manufacturing Co., Ltd, Hsin-Chu (TW)

(72) Inventors: Kuo-Yuan Ho, Hsinchu (TW); Jung-Wei Lee, Hsinchu (TW); Ming-Te Chen, Hsinchu (TW)

(73) Assignee: TAIWAN SEMICONDUCTOR MANUFACTURING CO., LTD, Hsin-Chu (TW)

(*) Notice: Subject to any disclaimer, the term of this patent is extended or adjusted under 35 U.S.C. 154(b) by 112 days.

(21) Appl. No.: 14/170,837

(22) Filed: Feb. 3, 2014

(65) Prior Publication Data

US 2015/0221515 A1    Aug. 6, 2015

(51) Int. Cl.
| | |
|---|---|
| H01L 21/8234 | (2006.01) |
| H01L 21/265 | (2006.01) |
| H01L 21/67 | (2006.01) |
| H01L 21/677 | (2006.01) |

(52) U.S. Cl.
CPC ... *H01L 21/26593* (2013.01); *H01L 21/67109* (2013.01); *H01L 21/67115* (2013.01); *H01L 21/67201* (2013.01); *H01L 21/67213* (2013.01); *H01L 21/67745* (2013.01)

(58) Field of Classification Search
CPC .............. H01L 21/26593; H01L 21/67109; H01L 21/67115; H01L 21/67201; H01L 21/67213; H01L 21/67745
USPC .................................................. 438/275
See application file for complete search history.

(56) References Cited

U.S. PATENT DOCUMENTS

| | | | |
|---|---|---|---|
| 2002/0000029 A1* | 1/2002 | Emoto | B82Y 10/00 29/25.01 |
| 2008/0044257 A1* | 2/2008 | England | H01L 21/67069 414/217.1 |
| 2008/0124903 A1* | 5/2008 | England | H01J 37/3171 438/530 |
| 2010/0181500 A1* | 7/2010 | Chang | C30B 31/22 250/492.21 |

OTHER PUBLICATIONS

3M Novec 7500 Product Information, Sep. 9, 2008.*

* cited by examiner

*Primary Examiner* — Matthew Gordon
(74) *Attorney, Agent, or Firm* — McClure, Qualey & Rodack, LLP

(57) ABSTRACT

Embodiments of method for cooling a wafer in an ion implantation process are provided. A method for cooling the wafer in the ion implantation process includes placing the wafer in a process module. The method also includes performing the ion implantation process on the wafer and simultaneously cooling the wafer in the process module. The method further includes removing the wafer from the process module. In addition, the method includes heating up the wafer.

17 Claims, 8 Drawing Sheets

METHOD AND APPARATUS FOR COOLING WAFER IN ION IMPLANTATION PROCESS

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

Ion implantation is a process in semiconductor manufacturing that is performed accurately and reliably. By employing ion implantation process, the majority of charge carriers may be altered so as to produce different types and levels of conductivity in regions of a wafer. Ion implanters are automated tools which are expensive and are kept running reliably. In an ion implanter, an ion generator may generate an ion beam and direct the ion beam towards the target wafer.

Although existing devices and methods for implanting ion implantation process have been generally adequate for their intended purposes, they have not been entirely satisfactory in all respects. Consequently, it would be desirable to provide a solution for ion implantation for use in a wafer process apparatus.

BRIEF DESCRIPTION OF THE DRAWINGS

For a more complete understanding of the embodiments and the advantages thereof, reference is now made to the following descriptions taken in conjunction with the accompanying drawings.

DETAILED DESCRIPTION OF THE ILLUSTRATIVE EMBODIMENTS

The making and using of the embodiments of the disclosure are discussed in detail below. It should be appreciated, however, that the embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows include embodiments in which the first and second features are formed in direct contact, and may also include embodiments in which additional features may be formed between the first and second features, such that the first and second features may not be in direct contact.

FIGS. 1-8 have been simplified for the sake of clarity to better understand the inventive concepts of the present disclosure. Throughout the various views and illustrative embodiments, like reference numbers are used to designate like elements.

Figure 1:
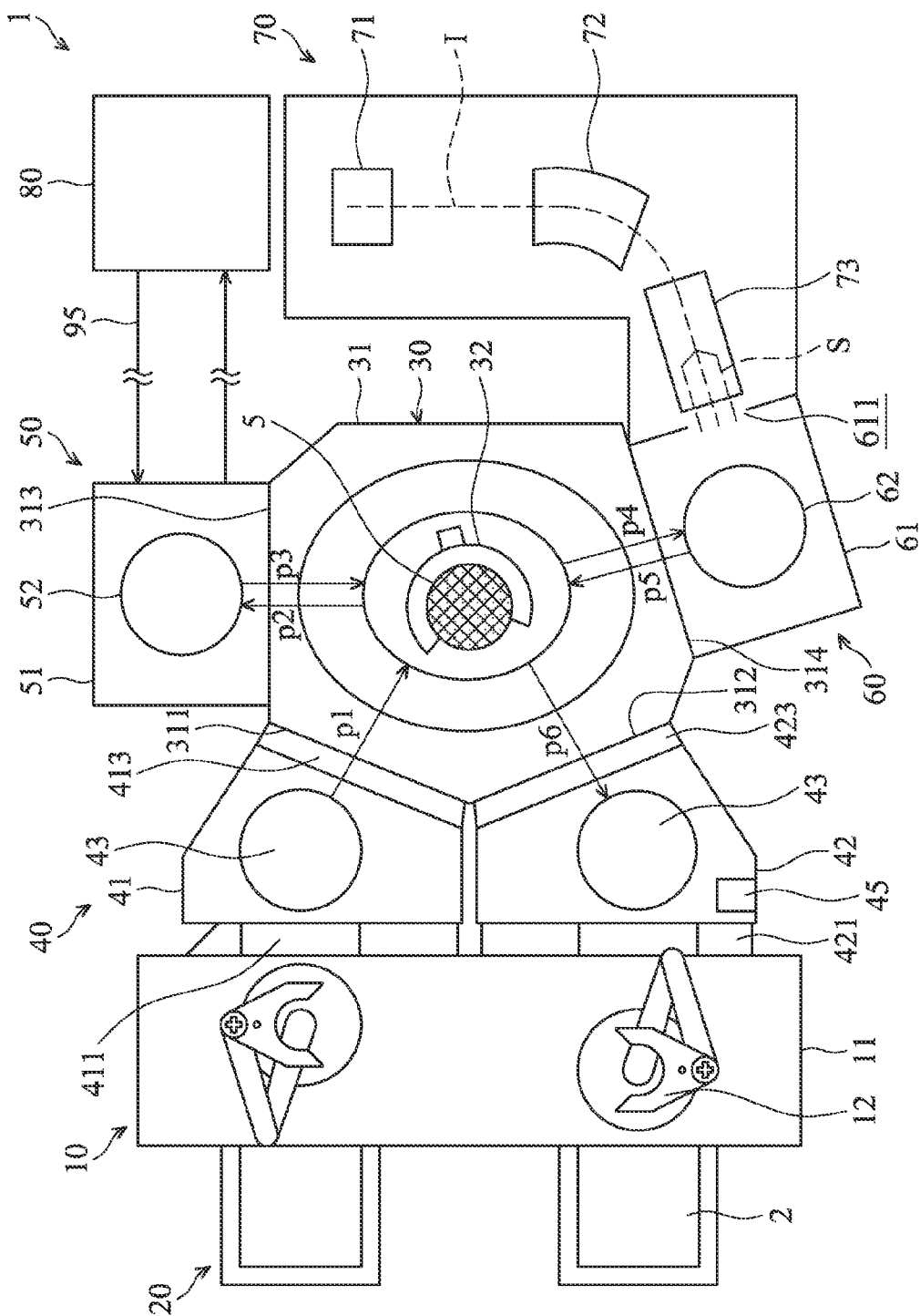
FIG. 1 is a top schematic view of a wafer process apparatus, in accordance with some embodiments.

FIG. 1 shows a top schematic view of a wafer processing apparatus 1, in accordance with some embodiments. The wafer processing apparatus 1 is configured to process one or more wafers 5. The wafer 5 may include a semiconductor, conductor, and/or insulator layers. In some embodiments, the wafer 5 includes layered semiconductors. Examples include the layering of a semiconductor layer on an insulator such as that used to produce a silicon-on-insulator (SOI) substrate, a silicon-on-sapphire substrate, or a silicon-germanium-on-insulator substrate, or the layering of a semiconductor on glass to produce a thin film transistor (TFT). The wafer 5 may go through many processing steps, such as lithography, etching, and/or doping before a completed die is formed.

In some embodiments, the wafer processing apparatus 1 is configured to perform an ion implantation process on the wafer 5. The wafer processing apparatus 1 includes an interface module 10, a load-port module 20, a wafer transfer module 30, a loadlock module 40, a pre-cooling module 50, a process module 60, a beam generator module 70, and a coolant source assembly 80, in accordance with some embodiments. Additional features can be added to the wafer process apparatus, and some of the features described below can be replaced or eliminated in other embodiments of the wafer process apparatus.

The interface module 10 and the load-port module 20 are configured to handle the wafer 5 from outside of the wafer processing apparatus 1. The wafer transfer module 30 is configured to move the wafer from and to the loadlock module 40, the pre-cooling module 50, and the process module 60 connected to different sides of the wafer transfer module 30. The process module 60 is configured to perform an ion implantation process on the wafer 5. The coolant source assembly 80 is configured to provide a coolant to the pre-cooling module 50 and the process module 60 to cool the wafer 5. Structural features of each module will become apparent from the following description and drawings.

The interface module 10 includes a housing 11, and one or more transferring means such as a robotic arm 12, in accordance with some embodiments. In some embodiments, the interface module 10 is a facility interface. In some embodiments, the interface module 10 includes an equipment front end module (EFEM). The robotic arm 12 is disposed within the housing 11. The robotic arm 12 is configured for physically transporting the wafer 5. For example, the robotic arm 12 retrieves the wafer 5 from a carrier 2 to the housing 11, or the robotic arm 12 transports the wafer 5 to and from the loadlock module 40. However, the locations where the robotic arm 12 transports the wafer 5 are not limited by the present embodiment.

In some embodiments, the load-port module 20 is adjacent to the interface module 10. In some embodiments, an overhead hoist transport (OHT) (not shown) transports the carrier 2, such as a standard mechanical interface (SMIF) or front opening unified pod (FOUP) with the wafer 5 from a stocker (not shown) to the load-port module 20. The carrier 2 is handled by the load-port module 20, so that the wafer transfer module 30 is accessed by wafer transfer module 30.

In some embodiments, the wafer transfer module 30 is configured to move the wafer 5 from and to different destination in the wafer processing apparatus 1. In some embodiments, the wafer transfer module 30 includes a wafer transfer chamber 31 and a wafer handling means 32, in accordance with some embodiments. The wafer transfer chamber 31 includes one or more sides, such as sides 311, 312, 313, and 314, to connect the wafer transfer chamber 31 to other modules, arranged outside of the wafer transfer chamber 31. The wafer handling means 32 is adapted to go through a slit valve for delivering or withdrawing the wafer 5 to and from a destination. The wafer handling means 32 may be robotic and may be controllable by a computer program, or may be controllable by an operator, or both, for example.

In some embodiments, the loadlock module 40 is configured for preserving the atmosphere within the wafer transfer module 30 by separating it from the interface module 10. The loadlock module 40 includes one or more loadlock chambers. For example, the loadlock module 40 includes two loadlock chambers 41 and 42. In some embodiments, as shown in FIG. 1, the loadlock chamber 41 is connected to the side 311 of the wafer transfer chamber 31, and the loadlock chamber 42 is connected to the side 312 adjacent to the side 311 of the wafer transfer chamber 31. As such, the loadlock chambers 41 and 42 are arranged laterally.

The loadlock module 40 also includes a number of doors, such as door 411, 413, 421, and 423. The doors 411 and 421 are respectively positioned between the interface module 10 and the loadlock chambers 41 and 42. The doors 413 and 423 are respectively positioned between the wafer transfer module 30 and the loadlock chambers 41 and 42. In addition, each of loadlock chambers 41 and 42 includes a stage 43 for supporting the wafer 5 placed inside.

In some embodiments, the loadlock chamber 41 is configured to receive the wafer 5 from the interface module 10. When the wafer 5 is inserted into the loadlock chamber 41, both doors 411 and 413 are sealed. The loadlock chamber 41 creates an atmosphere compatible with the wafer transfer module 30 by altering the gas content of the loadlock chamber 41 by suitable means for adjusting atmosphere in the loadlock chamber 41. When the desired atmosphere in the loadlock chamber 41 has been created, the door 413 is opened, and the wafer 5 is accessed by wafer handling means 32 of the wafer transfer module 30.

In some embodiments, the loadlock chamber 42 is configured to receive wafer 5 from the wafer transfer module 30. When the wafer 5 is inserted into the loadlock chamber 42, both doors 421 and 423 are sealed. The loadlock chamber 42 creates an atmosphere compatible with the interface module 10 by altering the gas content of the loadlock chamber 42 by suitable means for adjusting atmosphere in the loadlock chamber 42. When the desired atmosphere in the loadlock chamber 42 has been created, the door 421 is opened, and the wafer 5 is accessed by the robotic arm 12 of the interface module 10.

In some embodiments, the loadlock chamber 42 further includes a heating member 45. The heating member 45 is configured to heat up the wafer 5 after the ion implantation process. Specifically, the heating member 45 is disposed in the loadlock chamber 42 to heat up the loadlock chamber 42. In some embodiments, the heating member 45 is disposed in a position corresponding to the stage 43. When the wafer 5 is placed on the stage 43, the heat from the heating member 45 is directly irradiated to the wafer 5. As a result, the wafer 5 is heated up rapidly to room temperature or any desired temperature. In some embodiments, wafer 5 in the loadlock chamber 42 is heated up to a temperature in a range from about 35° C. to about 50° C. The heating member 45, for example, is an electric incandescent lamp or a light irradiation-type heat treatment device. However, the heating member 45 can be any element that generates heat by itself or with high thermal conductivity to conduct heat from a heat source.

In some embodiment, the pre-cooling module 50 is configured to cool the wafer 5 placed inside. The pre-cooling module 50 includes a pre-cool chamber 51 and a cooling stage 52, in accordance with some embodiments. The pre-cool chamber 51 is connected to the side 313 of the wafer transfer chamber 31. The cooling stage 52 is positioned in the pre-cool chamber 51 and configured for supporting the wafer 5 as it is being inserted the pre-cool chamber 51. The pre-cooling module 50 is configured to cool the wafer 5 placed inside. In some embodiments, at least one fluid channel (not shown in FIG. 1) is formed within the cooling stage 52 and fluidly connected to the coolant source assembly 80. A coolant from the coolant source assembly 80 passes through the cooling stage 52 to cool the wafer 5 placed on the cooling stage 52.

The process module 60 includes an end station chamber 61 and a scan drive assembly 62, in accordance with some embodiments. The end station chamber 61 is connected to the side 314 of the wafer transfer chamber 31. In addition, the end station chamber 61 has an opening 611 formed adjacent to the beam generator module 70 so as to receive ion beam from the beam generator module 70. The scan drive assembly 62 is positioned in the end station chamber 61 and configured for supporting the wafer 5 inserted the end station chamber 61. One exemplary design of the scan drive assembly 62 is described below in connection with FIG. 2.

The beam generator module 70 includes a source terminal assembly 71, a beam line assembly 72, and a scan assembly 73, in accordance with some embodiments. The beam generator module 70 is configured to inject ions (dopants) into the wafer 5 held by the scan drive assembly 62 according to a desired dosing profile. In some embodiment, in operation of the beam generator module 70, the source terminal assembly 71 generates an ion beam I. The beam line assembly 72 has a mass analyzer, and the ions, having the appropriate charge-to-mass ratio, are allowed to enter the scan assembly 73. The scan assembly 73 laterally diverts or scans the ion beam I back and forth in time to provide the scanned ion beam S. Afterward, the scanned ion beam S is redirected by the scan assembly 73 so that the ion beam strikes a surface of the wafer 5 held by the scan drive assembly 62 at the same angle of incidence.

Figure 2:
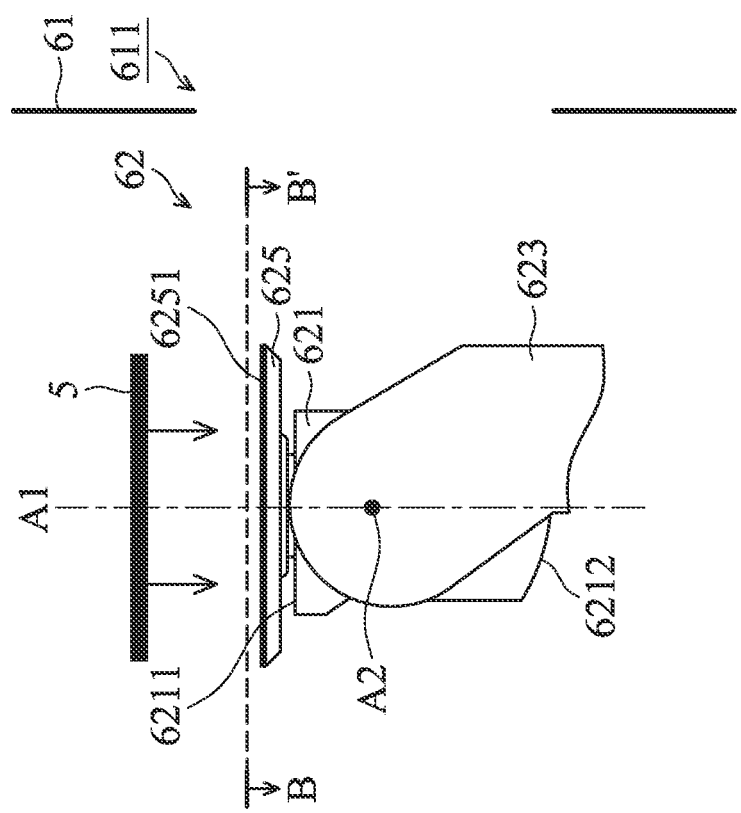
FIG. 2 is a schematic view of the scan drive assembly, in accordance with some embodiments.

Referring to FIG. 2, a schematic view of the scan drive assembly 62 is shown, in accordance with some embodiments. In some embodiments, the scan drive assembly 62 includes a first drive mechanism 621, a second drive mechanism 623, and a wafer holder 625. In some embodiments, the first drive mechanism 621 has a cylindrical configuration with an anterior surface 6211 and a posterior surface 6212 opposite to the anterior surface 6211. The first drive mechanism 621 includes an electric machine, such as a step motor, to actuate the wafer holder 625 to rotate about a rotation axis A1. The wafer holder 625 is rotatably positioned over the anterior surface 6211 and includes a supporting surface 6251 to support the wafer 5. By rotating the wafer holder 625, an even implantation on the wafer 5 is achieved.

The second drive mechanism 623 is connected to the first drive mechanism 621 via the tilt axis A2. The second drive mechanism 623 includes an electric machine, such as a step motor, to actuate the first drive mechanism 621 to tilt around the tilt axis A2. In some embodiments, the first drive mechanism 621 is tilted relative to a horizontal plane by, for example, ±60° to accommodate angled ion implantation.

Figure 3:
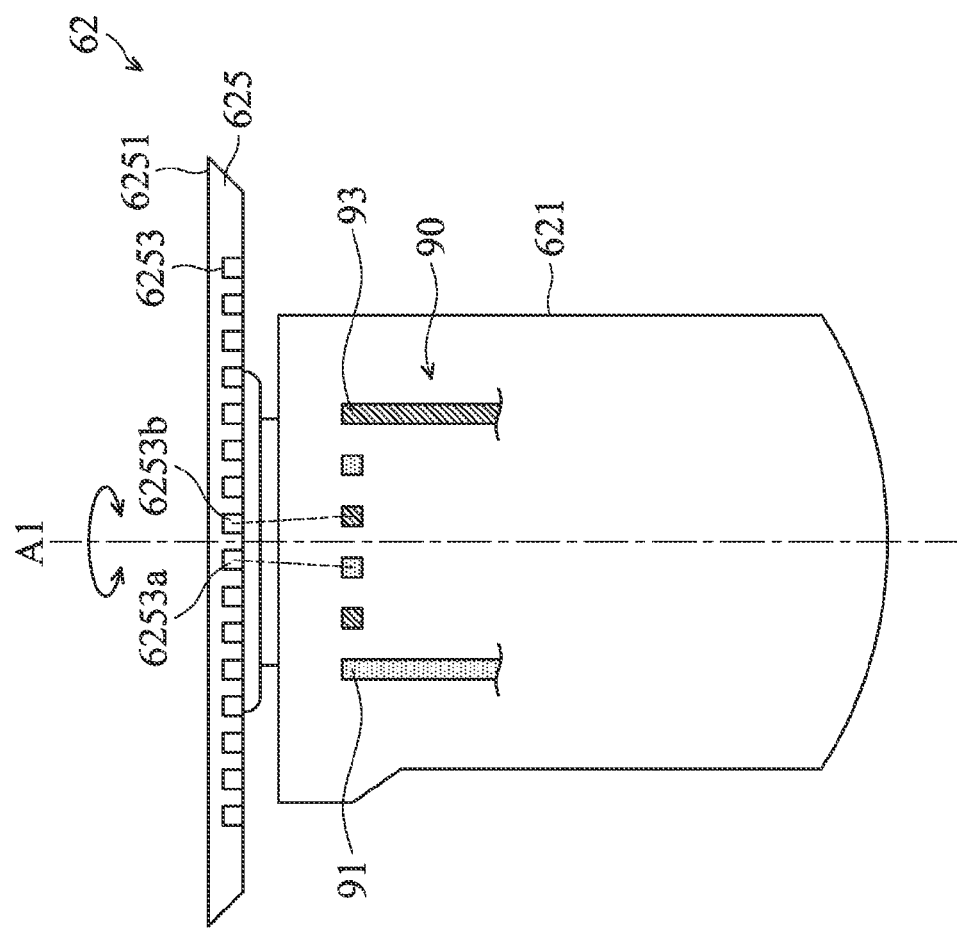
FIG. 3 is a cross sectional view of a scan drive assembly taken along the line B-B' of FIG. 2, in accordance with some embodiments.

Referring to FIG. 3, a cross sectional view of the scan drive assembly 62 taken along the line B-B' of FIG. 2 is shown, in accordance with some embodiments. In some embodiments, one or more fluid channels is formed within the wafer holder 625 (i.e., beneath the supporting surface 6251 of the wafer holder 625). For example, a fluid channel 6253, arranged in a spiral manner, is formed within the wafer holder 625. The fluid channel 6253 includes an inlet 6253a for receiving a fluid and an outlet 6253b for exhausting the fluid.

In some embodiments, the wafer processing apparatus 1 also includes a flexible coolant pipe 90. The flexible coolant pipe 90 is arranged in the scan drive assembly 62 and fluidly connected to fluid channel 6253. In addition, the flexible coolant pipe 90 is fluidly connected to the pre-cooling module 50 and/or the coolant source assembly 80 (FIG. 1). One exemplary relationships among these elements is described below in connection with FIG. 5. As a result, the coolant provided from the coolant source assembly 80 is circulated to the fluid channel 6253 via the flexible coolant pipe 90.

Figure 4B:
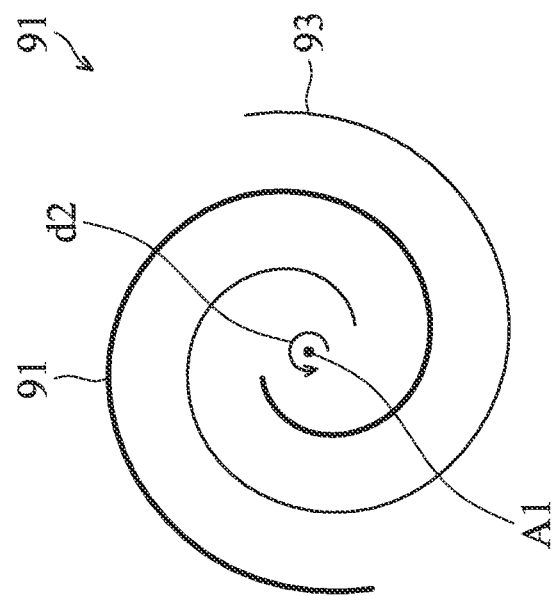
FIGS. 4A and 4B are top views of a flexible coolant pipe, in accordance with some embodiments.
Figure 4A:
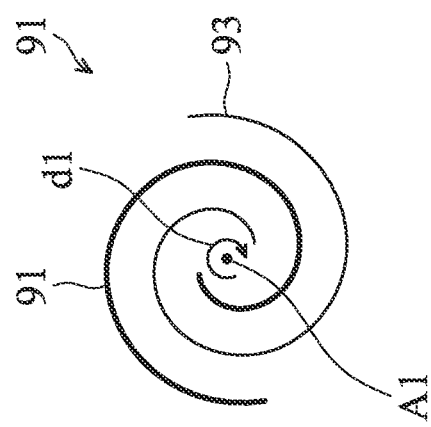

Referring to FIGS. 4A and 4B, in some embodiment, the flexible coolant pipe 90 includes a first segment 91 and a second segment 93. The first segment 91 is arranged surrounding the rotation axis A1 in a spiral manner and fluidly connected to the inlet 6253a of the fluid channel 6253 (FIG. 3). The second segment 93 is arranged surrounding the rotation axis A1 in a spiral manner and fluid connected to the outlet 6253b of the fluid channel 6253 (FIG. 3). With such an arrangement, as shown in FIG. 4A, when the wafer holder 625 is actuated to rotate about the rotation axis A1 in a first direction d1 (e.g., a clockwise direction), the first segment 91 and the second segment 93 approach toward the rotation axis A1. As shown in FIG. 4B, when the wafer holder 625 is actuated to rotate about the rotation axis A1 in a second direction d2 opposite to the first direction d1 (e.g., a counterclockwise direction), the first segment 91 and the second segment 93 are away from the rotation axis A1. Therefore, the detachment of the flexible coolant pipe 90 due to rotation is prevented, and the leakage of the coolant is avoided. In some embodiments, the flexible coolant pipe 90 includes suitable material which maintains sufficient flexibility at low temperatures. For example, the flexible coolant pipe 90 comprises polyurethane, or a thermoplastic polymer, such as TPEE (Thermoplastic Polyester Elastomer).

Figure 5:
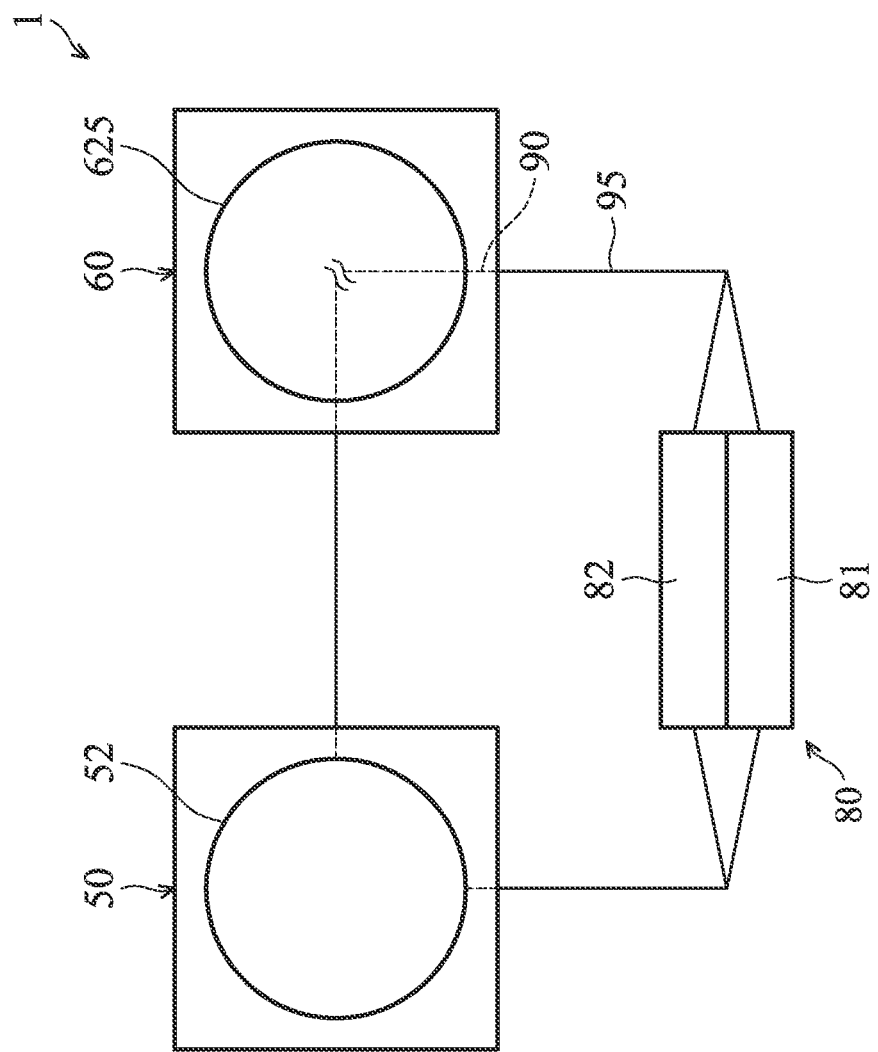
FIG. 5 is a partial schematic diagram of a wafer process apparatus, in accordance with some embodiments.

Referring to FIG. 5, a partial schematic diagram of the wafer process apparatus 1 is shown, in accordance with some embodiments. In some embodiments, the wafer process apparatus 1 further includes a fluid route 95. The fluid route 95 includes a number of rigid pipes that physically connect to the pre-cooling module 50, the process module 60, and the coolant source assembly 80. Through the fluid route 95, the coolant is circulated from the coolant source assembly 80 to the pre-cooling module 50 and the process module 60.

In some embodiments, the coolant passing through the fluid route 95 is transmitted into the cooling stage 52 of the pre-cooling module 50, and the heat of the cooling stage 52 is taken away and transmitted to the coolant. In addition, the coolant passing through the fluid route 95 is transmitted into the wafer holder 625 of the process module 60 via the flexible coolant pipe 90, and the heat of the wafer holder 625 is taken away and transmitted to the coolant. Therefore, when the wafer (not shown in FIG. 5) is placed on the cooling stage 52 and/or the wafer holder 625, the heat of the wafer is taken away via the cooling stage 52 and/or the wafer holder 625 and transmitted to the coolant.

In some embodiments, the coolant source assembly 80 is fluidly connected to the pre-cooling module 50 and the flexible coolant pipe 90 in series. As a result, the fluid pressure of the coolant is maintained during its circulation along the fluid route 95. In some embodiments, the coolant source assembly 80 includes one or more compressors to cool the coolant at different pressures. For example, the coolant source assembly 80 includes a two stage chiller including a first compressor 81 and a second compressor 82. The first compressor 81 and the second compressor 82 operate at different pressures. While in operation, the coolant is cooled in two stages. For example, the coolant is cooled by the first compressor 81 to a first predetermined temperature in a range from about 0° C. to about −30° C. Afterwards, the coolant is cooled by the second compressor 82 to a second predetermined temperature in a range from about −30° C. to about −50° C. With such an arrangement, the performance of both of the first and second compressors 81 and 82 are improved.

In some embodiments, the coolant includes liquid nitrogen, solid carbon dioxide, liquid ammonia, and mixed refrigerants. In some embodiments, the coolant includes 2-trifluoromethyl-3-ethoxydodecafluorohexane. The 2-trifluoromethyl-3-ethoxydodecafluorohexane exhibits a good flowing ability at low temperature, such as a temperature in a range from about 50° C. to about −60° C. Therefore, the cooling efficiency is maintained when the coolant is at a low temperature.

Figure 6:
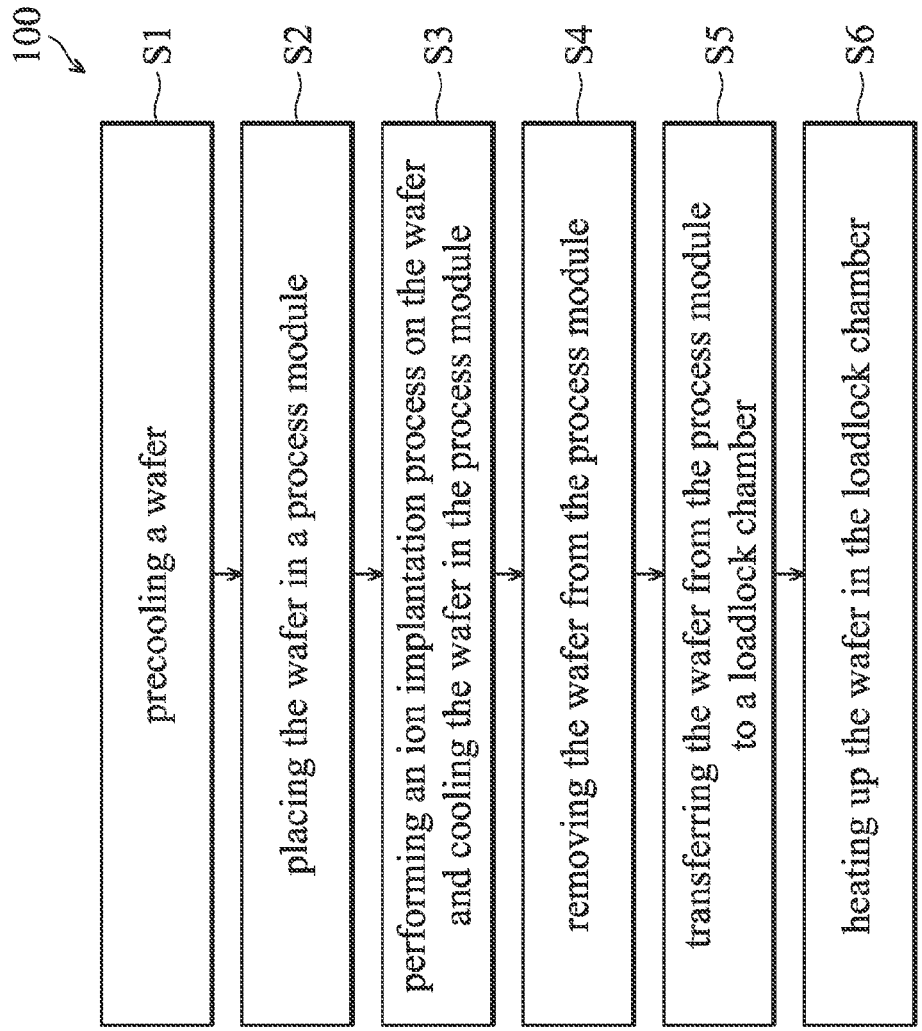
FIG. 6 is a flow chart illustrating a method for cooling a wafer by a wafer process apparatus, in accordance with some embodiments.

Referring to FIG. 6 and with reference to FIG. 1, a flow chart illustrating a method 100 for cooling the wafer 5 by a wafer process apparatus (such as the wafer process apparatus 1), in accordance with some embodiments, is shown in FIG. 6. In some embodiments, the wafer process apparatus 1 includes a wafer transfer module (such as the wafer transfer module 30) for transferring the wafer 5, a loadlock module (such as the loadlock module 40) for preserving the atmosphere within the wafer transfer module 30, a pre-cooling module (such as the pre-cooling module 50) for cooling the wafer 5, and a process module (such as the process module 60) for processing the wafer 5.

The method 100 begins with operation S1, in which the wafer 5 is pre-cooled to a predetermined temperature. In some embodiments, the wafer 5 is transferred from the loadlock chamber 41 of the loadlock module 40 to the pre-cooling module 50 via the paths p1 and p2, as shown in FIG. 1, by the wafer transfer module 30. In some embodiments, the wafer 5 is cooled to a temperature in a range from about −20° C. to about −50° C.

The method 100 continues with operation S2, in which the wafer 5 is placed in the process module 60. In some embodiments, the wafer 5 is transferred from the pre-cooling module 50 to the process module 60 via the paths p3 and p4, as shown in FIG. 1, by the wafer transfer module 30. The wafer 5 is pre-cooled in the pre-cooling module 50 to the predetermined temperature before the wafer 5 is transferred to the process module 60. In some embodiments, the wafer 5 is not moved out of the pre-cooling module 50 if the process module 60 is occupied by another wafer 5. In some embodiments, the wafer 5 is held by the scan drive assembly 62 of the process module 60 as it is in the process module 60.

The method 100 continues with operation S3, in which an ion implantation process is performed on the wafer 5 and simultaneously the wafer 5 is cooled in the process module 60. In some embodiments, the wafer 5 is cooled by the coolant passing through the wafer holder 625 to a low temperature in a range from about −20° C. to about −50° C. In some embodiments, the flow rate of the coolant is in a range from about 5 mL/mins to about 10 mL/mins. The coolant supply pressure is in a range from about 80 Psi to about 110 Psi.

In some embodiments, when ion implantation process is conducted at high temperatures, sufficient energy is imparted to the wafer 5 by the incoming ions. The energy causes individual point defects to arrange themselves in a lower energy configuration. These defects are detrimental to the operation of any resulting device formed from the wafer 5. However, since the heat from the wafer 5 is taken away by the coolant passing through the wafer holder 652, defects being formed on the wafer 5 is avoided.

Figure 7:
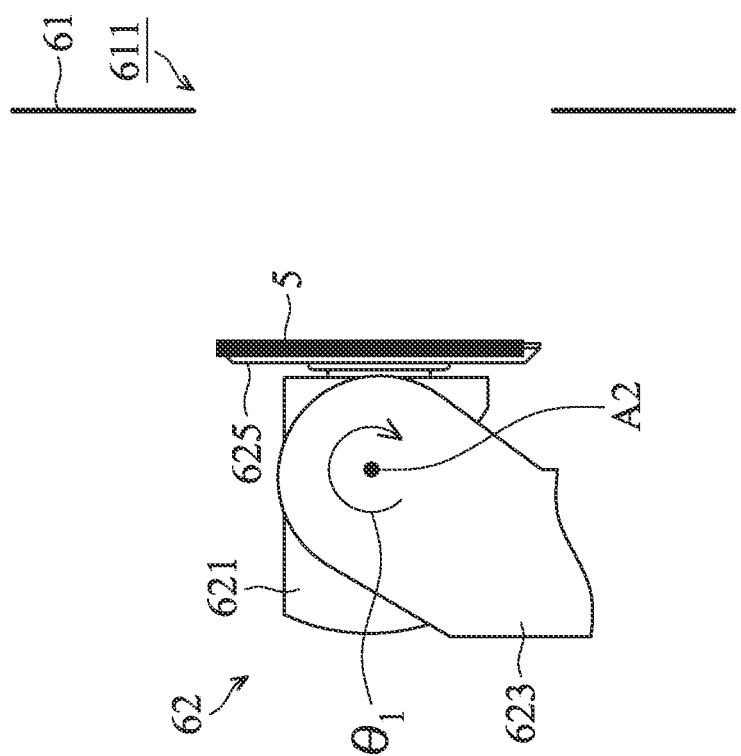
FIG. 7 is a side view of one of the stages of an ion implantation process, in accordance with some embodiments.
Figure 8:
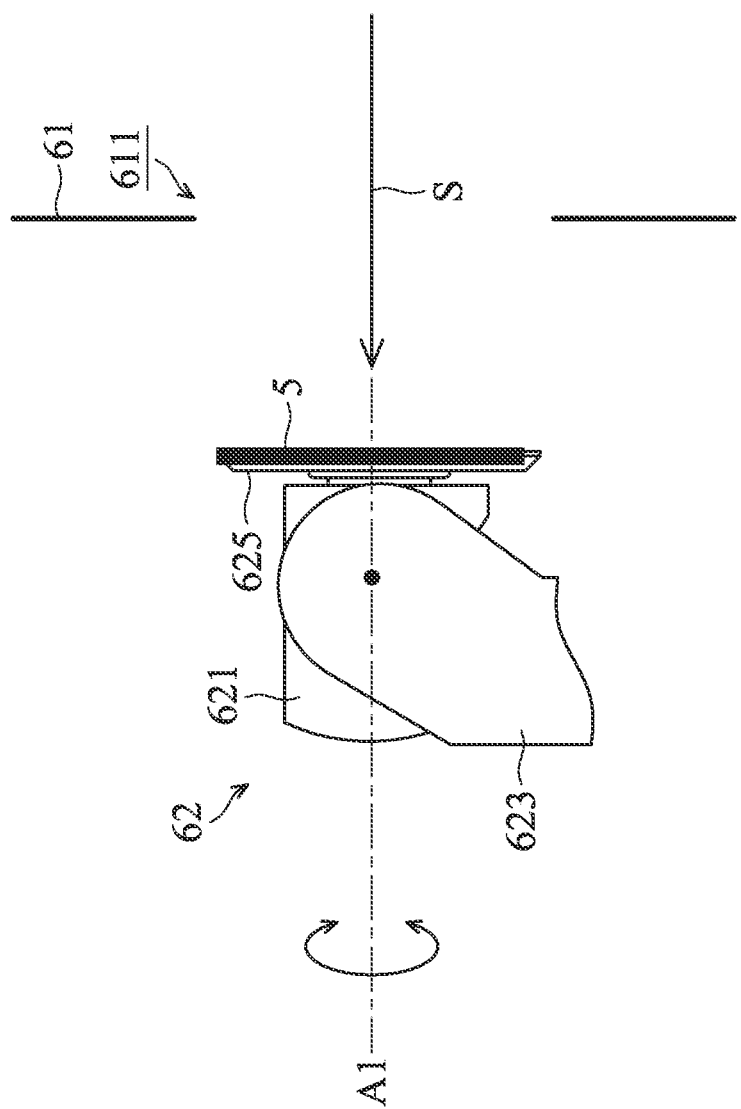
FIG. 8 is a side view of one of the stages of an ion implantation process, in accordance with some embodiments.

Referring to FIGS. 7 and 8, side views of various stages of an ion implantation process are shown, in accordance with some embodiments. In some embodiments, as shown in FIG. 7, after the wafer 5 is placed on the wafer holder 625, the first drive mechanism 621 is rotated about the tilt axis A2 by a rotation angle $\theta_1$ of about 90 degrees counterclockwise, to allow the wafer 5 to face the opening 611. Afterward, as shown in FIG. 7, the scanned ion beam S is projected on the wafer 5 through the opening 611. In some embodiments, to increase the uniformity of the ion implantation, the wafer holder 625 and the wafer 5 are rotated about the rotation axis A1 when the ion implantation process is performed.

The method 100 continues with operation S4, in which the wafer 5 is removed from the processing module 60. In some embodiments, the wafer 5 is removed from the processing module 60 to the loadlock chamber 42 of the loadlock module 40 after the ion implantation process is finished. In some embodiments, the wafer 5 is transferred from the process module 60 to the loadlock chamber 42 via the paths p5 and p6, as shown in FIG. 1, by the wafer transfer module 30.

The method 100 continues with operation S5, in which the wafer 5 is heated up in the loadlock chamber 42 of the loadlock module 40. In some embodiments, the wafer 5 is heated up to room temperature. It is understood that exposure of the ambient air to the wafer 5 with relative low temperature may result in ice forming from moisture. To prevent this occurrence, the wafer 5 is therefore heated by the heating member 45 in the loadlock module 40 before it is moved out of the loadlock module 40. In some embodiments, loadlock chamber 42 is heated up to a temperature in a range from about 35° C. to about 50° C. In some embodiments, the wafer 5 is placed inside of the loadlock chamber 42 for about 60 seconds.

Embodiments of mechanisms for cooling a wafer are provided. The wafer is held by a scan drive assembly, and coolant is supplied into the scan drive assembly through a flexible coolant pipe. The wafer is directly cooled by the scan drive assembly while the wafer is subjected to an ion implantation process. Therefore, the operation time for ion implantation process is greatly reduced. In addition, since the flexible coolant pipe exhibits good flexibility at low temperatures, the wafer is rotated during the cooling process. Therefore, the implantation quality is improved.

In accordance with some embodiments, a method for cooling a wafer in an ion implantation process is provided. The method includes placing the wafer in a process module. The method also includes performing the ion implantation process on the wafer and simultaneously cooling the wafer in the process module. The method further includes removing the wafer from the process module. In addition, the method includes heating up the wafer.

In accordance with some embodiments, a method for cooling a wafer in an ion implantation process is provided. The method includes pre-cooling the wafer in a pre-cooling module before the ion implantation process. The method also includes placing the wafer on the wafer holder. The method further includes performing the ion implantation process on the wafer and simultaneously providing a coolant to the wafer holder to directly cool the wafer. In addition, the method includes removing the wafer from the wafer holder and heating up the wafer in a loadlock chamber.

In accordance with some embodiments, an apparatus for cooling a wafer in an ion implantation process is provided. The apparatus includes a process module. The process module is configured to performed the ion implantation process on the wafer. The wafer process apparatus also includes a coolant source assembly. The coolant source assembly is configured to provide a coolant to the process module to cool the wafer while simultaneously processing the ion implantation process. The wafer process apparatus further includes a heating member. The heating member is configured to heat up the wafer after the ion implantation process.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method for cooling a wafer in an ion implantation process, comprising:

placing the wafer in a process module;

performing the ion implantation process on the wafer and simultaneously cooling the wafer in the process module;
providing the coolant to the process module via a first segment of flexible coolant pipe;
removing the coolant from the process module via a second segment of flexible coolant pipe;
wherein the first segment and the second segment of the flexible coolant pipe are arranged about a rotation axis in a spiral manner, and the coolant has a temperature in a range from about −30° C. to about −50° C.;
rotating the wafer about the rotation axis while the ion implantation process is performed, wherein each of the first segment and the second segment of flexible coolant pipe approaches toward or is away from the rotation axis during the rotation of the wafer;
removing the wafer from the process module; and
heating up the wafer.

2. The method as claimed in claim 1, further comprising pre-cooling the wafer in a pre-cooling module before placing the wafer in the process module.

3. The method as claimed in claim 1, further comprising cooling the coolant by a first compressor and a second compressor, wherein the first compressor and the second compressor operate at different pressures.

4. The method as claimed in claim 1, wherein the coolant comprises 2-trifluoromethyl-3-ethoxydodecafluorohexane.

5. The method as claimed in claim 1, wherein the flexible coolant pipe comprises polyurethane.

6. The method as claimed in claim 1, wherein performing an ion implantation process comprises controlling the temperature of the wafer in a range from about −20° C. to about −50° C.

7. The method as claimed in claim 2, wherein the coolant is circulated from a coolant source assembly via the pre-cooling module to the process module to directly cool the wafer.

8. The method as claimed in claim 1, wherein during the operation of placing the wafer in a process module, the temperature of the wafer is in a range from about −20° C. to about −50° C.

9. The method as claimed in claim 1, wherein the wafer is heated in a loadlock chamber, and during the operation of heating up the wafer, the atmosphere in the loadlock chamber is adjusted.

10. A method for cooling a wafer in an ion implantation process, comprising:

pre-cooling the wafer in a pre-cooling module before the ion implantation process;
placing the wafer on a wafer holder;
performing the ion implantation process on the wafer and simultaneously cooling the wafer holder;
providing a coolant to the wafer holder via a first segment of flexible coolant pipe to directly cool the wafer;
removing the coolant from the wafer holder via a second segment of flexible coolant pipe;
wherein the first segment and the second segment of the flexible coolant pipe are arranged about a rotation axis in a spiral manner, and the coolant has a temperature in a range from about −30° C. to about −50° C.;
rotating the wafer about the rotation axis while the ion implantation process is performed, wherein each of the first segment and the second segment of flexible coolant pipe approaches toward or is away from the rotation axis during the rotation of the wafer;
removing the wafer from the wafer holder; and
heating up the wafer in a loadlock chamber.

11. The method as claimed in claim 10, wherein the flexible coolant pipe comprises polyurethane.

12. The method as claimed in claim 10, further comprising cooling the coolant by a first compressor and a second compressor, wherein the first compressor and the second compressor operate at different pressures.

13. The method as claimed in claim 10, wherein the coolant comprises 2-trifluoromethyl-3-ethoxydodecafluorohexane.

14. The method as claimed in claim 10, wherein performing the ion implantation process comprises controlling the temperature of the wafer in a range from about −20° C. to about −50° C.

15. The method as claimed in claim 10, wherein the coolant is circulated from a coolant source assembly via the pre-cooling module to the wafer holder to directly cool the wafer.

16. The method as claimed in claim 10, wherein during the operation of placing the wafer on a wafer holder, the temperature of the wafer is in a range from about −20° C. to about −50° C.

17. The method as claimed in claim 10, wherein during the operation of heating up the wafer in a loadlock chamber, the atmosphere in the loadlock chamber is adjusted.

* * * * *